United States Patent
Chen et al.

(10) Patent No.: US 9,082,669 B2
(45) Date of Patent: Jul. 14, 2015

(54) ARRAY SUBSTRATE AND PREPARATION METHOD THEREOF, DISPLAY PANEL AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Chen Chen, Shanghai (CN); Zhaokeng Cao, Shanghai (CN)

(73) Assignees: Shanghai AVIC Optoelectronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/464,603

(22) Filed: Aug. 20, 2014

(65) Prior Publication Data

US 2015/0162350 A1    Jun. 11, 2015

(30) Foreign Application Priority Data

Dec. 10, 2013  (CN) .......................... 2013 1 0670299

(51) Int. Cl.
| | | |
|---|---|---|
| *H01L 21/00* | (2006.01) | |
| *H01L 27/12* | (2006.01) | |
| *G02F 1/1368* | (2006.01) | |
| *G02F 1/1362* | (2006.01) | |

(52) U.S. Cl.
CPC ............ *H01L 27/124* (2013.01); *G02F 1/1368* (2013.01); *G02F 1/136213* (2013.01); *G02F 1/136286* (2013.01); *H01L 27/1259* (2013.01)

(58) Field of Classification Search
CPC .............. H01L 27/124; H01L 27/1259; G02F 1/136286; G02F 1/136213; G02F 1/1368
USPC ............................................................ 257/72
See application file for complete search history.

(56) References Cited

U.S. PATENT DOCUMENTS

| | | | | |
|---|---|---|---|---|
| 5,731,796 | A * | 3/1998 | Furuhashi et al. | 345/96 |
| 6,127,995 | A * | 10/2000 | Furuhashi et al. | 345/96 |
| 6,384,807 | B1 * | 5/2002 | Furuhashi et al. | 345/96 |
| 7,038,649 | B2 * | 5/2006 | Furuhashi et al. | 345/96 |
| 7,724,268 | B2 * | 5/2010 | Shin | 345/690 |
| 8,094,112 | B2 * | 1/2012 | Furuhashi et al. | 345/98 |
| 8,289,489 | B2 | 10/2012 | Im et al. | |
| 2002/0154086 | A1 * | 10/2002 | Furuhashi et al. | 345/100 |
| 2006/0125764 | A1 * | 6/2006 | Furuhashi et al. | 345/98 |
| 2007/0182897 | A1 * | 8/2007 | Shin | 349/117 |
| 2008/0180371 | A1 * | 7/2008 | Shie | 345/87 |
| 2009/0262059 | A1 * | 10/2009 | Chung et al. | 345/96 |

(Continued)

FOREIGN PATENT DOCUMENTS

CN          1945411 A           4/2007

*Primary Examiner* — Douglas Menz
(74) *Attorney, Agent, or Firm* — Kilpatrick, Townsend & Stockton LLP

(57) ABSTRACT

An array substrate is disclosed. The array substrate includes an array of pixel units on a substrate, gate lines, and data lines. The array substrate also includes common electrode lines. Each pixel unit includes a TFT, a pixel electrode, and a common electrode. The TFT is connected with one of the gate lines, one of the common electrode lines, and the common electrode. The pixel electrode is connected with the data line. In addition, the array of pixel units includes a plurality of first pixel units and a plurality of second pixel units with opposite potential polarities, where the first pixel units and the second pixel units are arranged alternatively in same rows/columns.

16 Claims, 4 Drawing Sheets

(56) References Cited

U.S. PATENT DOCUMENTS

| | | | |
|---|---|---|---|
| 2012/0091997 A1* | 4/2012 | Huang | 324/123 R |
| 2012/0112987 A1* | 5/2012 | Tan et al. | 345/32 |
| 2014/0176843 A1* | 6/2014 | Cao et al. | 349/43 |
| 2015/0042916 A1* | 2/2015 | Xu et al. | 349/43 |

\* cited by examiner

US 9,082,669 B2

ARRAY SUBSTRATE AND PREPARATION METHOD THEREOF, DISPLAY PANEL AND DISPLAY DEVICE

CROSS-REFERENCES TO RELATED APPLICATIONS

This application claims the benefit of priority to Chinese Patent Application No. 201310670299.7, filed with the Chinese Patent Office on Dec. 10, 2013 and entitled "ARRAY SUBSTRATE AND PREPARATION METHOD THEREOF, DISPLAY PANEL AND DISPLAY DEVICE", the content of which is incorporated herein by reference in its entirety.

TECHNICAL FIELD

The present invention relates to the field of liquid crystal displays, and particularly to an array substrate and a preparation method thereof, a display panel and a display device.

BACKGROUND OF THE INVENTION

A Thin Film Transistor Liquid Crystal Display (TFT-LCD) with the advantages of light weight, thinness, small occupied area, low power consumption, low radiation and the like is widely used in various data processing apparatuses, such as televisions, laptops, mobile phones, personal digital assistants, etc. With continuous development of electronic industry, the performance of the TFT-LCD is increasingly high.

A semiconductor switching device is configured in each pixel of the TFT-LCD, wherein the pixels are independent transistors isolated from one another. Because each pixel may be directly controlled through a dot pulse, each node is relatively independent and may be continuously controlled, in this way, the reaction time is shortened, and meanwhile, the gray scale control is very accurate.

Generally, a TFT includes a gate connected to a gate line, so that the TFT could be turned on and off through scan signals applied through the gate line. In addition, the TFT also includes a first electrode (for example, a source) connected to a data line and a second electrode (for example, a drain) connected to a pixel electrode. Liquid crystal molecules (or a liquid crystal layer) are arranged between the pixel electrode and a common electrode coupled to a common electrode line.

When the TFT-LCD works, the polarities of voltage differences applied to the liquid crystal molecules must be inverted at set intervals, to avoid permanent damage caused by polarization of a liquid crystal material and avoid an Image Sticking effect. Hence, various polarity inversion methods are proposed, including Frame Inversion, Line Inversion and Dot Inversion, wherein the line inversion specifically includes Row Inversion and Column Inversion. At the end of a frame write-in and before the start of the next frame write-in, if the voltage polarities in the pixels of a whole frame are the same (all positive or all negative), it is referred to as the frame inversion; if the voltage polarities in the pixels on the same column are the same and the voltage polarities in the pixels on the left and right adjacent columns are opposite, it is referred to as the column inversion; if the voltage polarities in the pixels on the same row are the same and the voltage polarities in the pixels on the upper and lower adjacent rows are opposite, it is referred to as the row inversion; and if the voltage polarity in each pixel is opposite to the voltage polarities in the upper and lower, left and right adjacent pixels, it is referred to as the dot inversion.

For the frame inversion manner, flicker will be generated as a result of nonuniform transmittance between continuous frames; and crosstalk easily occurs due to interference between adjacent data. For the row inversion manner, because the voltage differences with the same polarity are allocated to the pixels arranged horizontally, horizontal crosstalk easily occurs. For the column inversion manner, the horizontal crosstalk may be reduced, but vertical crosstalk easily appears.

Whereas for the dot inversion manner, the polarities of the voltage differences applied to adjacent pixels are mutually inverse in all directions to produce optimal image quality. However, in the dot inversion manner used at present, polarity inversion signals are generally provided by data lines, and polarity inversion is performed between pixel display dots, so the positive and negative polarity inversion signals provided by the data lines need to be frequently switched, and the display power consumption would be increased.

BRIEF SUMMARY OF THE INVENTION

One inventive aspect is an array substrate. The array substrate includes a substrate, an array of pixel units on the substrate, and a plurality of gate lines and a plurality of data lines on the substrate, where the gate lines cross the data lines near pixel units of the pixel unit array. The array substrate also includes a plurality of common electrode lines, where each pixel unit includes a TFT, a pixel electrode, and a common electrode. A gate of the TFT is electrically connected with a particular one of the gate lines, a source/drain of the TFT is electrically connected with a particular one of the common electrode lines, and a drain/source of the TFT is electrically connected with the common electrode. The pixel electrode is electrically connected with the data line. In addition, the array of pixel units includes a plurality of first pixel units and a plurality of second pixel units, where the first pixel units and the second pixel units are arranged alternatively in same rows/columns, and potential polarities of the common electrodes of the first pixel units and the second pixel units are opposite. Furthermore, the gate line and the common electrode line between the two adjacent rows of pixel units are electrically connected with the first pixel units of the two adjacent rows of pixel units, and the gate line and the common electrode line between two adjacent row unit groups are electrically connected with the second pixel units of two rows of pixel units which are adjacent to the gate line and the common electrode line.

Another inventive aspect is a method of preparing an array substrate. The method includes providing a substrate, forming an array of pixel units on the substrate, forming a plurality of gate lines and a plurality of data lines, where the gate lines cross the data lines near pixel units of the pixel unit array, and forming a plurality of common electrode lines on the substrate. Each pixel unit includes a TFT, a pixel electrode, and a common electrode. The method also includes electrically connecting gates of the TFTs with the gate lines, electrically connecting sources/drains of the TFTs with the common electrode lines, electrically connecting drains/sources of the TFTs with the common electrodes, and electrically connecting the pixel electrodes with the data lines, where the array of pixel units includes a plurality of first pixel units and a plurality of second pixel units, and where the first pixel units and the second pixel units are arranged alternatively in same rows/columns, and potential polarities of the common electrodes of the first pixel units and the second pixel units are opposite. The method also includes electrically connecting the gate line and the common electrode line between the two adjacent rows of pixel units with the first pixel units of the two adjacent rows of pixel units, and electrically connecting the gate line and the common electrode line between two adjacent row unit groups with the second pixel units of two rows of pixel units which are adjacent to the gate line and the common electrode line.

DETAILED DESCRIPTION OF THE PREFERRED EMBODIMENTS

The implementation processes of the embodiments of the present invention will be illustrated in detail below in combination with drawings of the description. It should be noted that the same or similar signs express the same or similar components or components with the same or similar functions throughout. The embodiments described with reference to the drawings below are exemplary, and are merely used for interpreting the present invention, rather than limiting the present invention.

Figure 1:
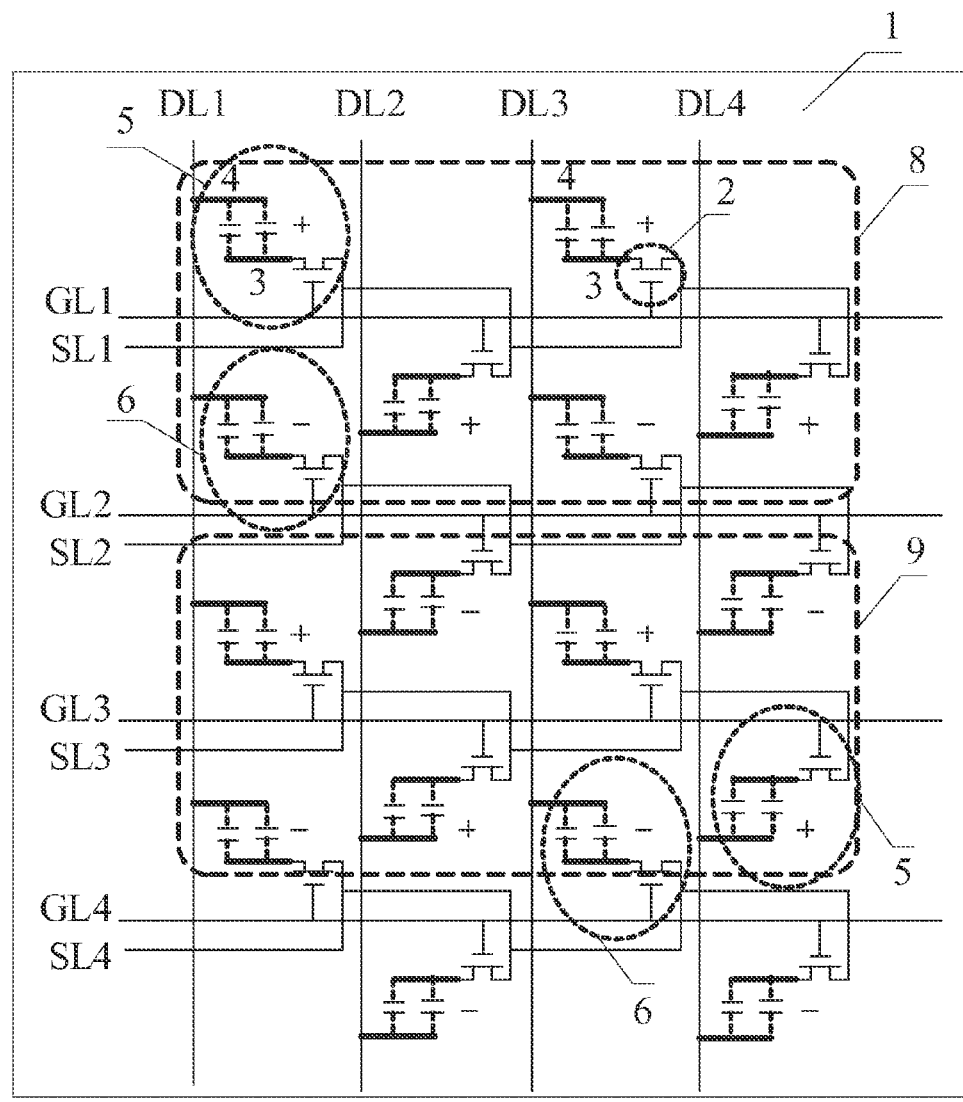
FIG. 1 is a schematic structural diagram of an array substrate according to an embodiment of the present invention.

As shown in FIG. 1, an embodiment of the present invention provides an array substrate, including a substrate 1, an array of pixel units defined by a plurality of gate lines and a plurality of data lines crossed on the substrate 1, and a plurality of common electrode lines; the gate lines are GL1, GL2, GL3 or GL4 arranged between two adjacent rows of pixel units as shown in FIG. 1; the data lines are DL1, DL2, DL3 or DL4 as shown in FIG. 1; and the common electrode lines are SL1, SL2, SL3 or SL4 arranged between two adjacent rows of pixel units as shown in FIG. 1. The gate lines, the data lines and the common electrode lines in the embodiment of the present invention should be understood that the number of the lines is respectively N, N is an integer more than 2, and this embodiment only shows part of the gate lines, the data lines and the common electrode lines.

Each pixel unit includes a TFT 2, and a pixel electrode 4 and a common electrode 3 arranged oppositely, wherein a gate of the TFT 2 is electrically connected with a gate line, a source/drain of the TFT is electrically connected with a common electrode line, the drain/source of the TFT is electrically connected with the common electrode 3, and the pixel electrode 4 is electrically connected with a data line.

During dot inversion, when a frame of picture is displayed, the TFT 2 writes a common electrode signal provided by the common electrode line into the common electrode 3, meanwhile, the data line supplies a data signal to the pixel electrode 4, thus energy is stored between the pixel electrode 4 and the common electrode 3 to form a pixel liquid crystal capacitor and a storage capacitor; and then the TFT 2 is turned off to stop writing the common electrode signal into the common electrode 3, and a display voltage difference is stored between the pixel electrode 4 and the common electrode 3. Within the retention time before the next frame of picture is displayed, due to the capacitance effect of the pixel liquid crystal capacitor and the storage capacitor, that is, the voltage difference between the pixel electrode 4 and the common electrode 3 is unchanged, although the voltage of the common electrode 3 of each pixel unit is changed along with other data signals, the display voltage difference is unchanged, so the display brightness is unchanged.

Further, all pixel units are divided into a plurality of first pixel units 5 and a plurality of second pixel units 6, the first pixel units 5 and the second pixel units 6 are arranged alternatively in same rows/columns, and the potential polarities of the common electrodes 3 of the first pixel units 5 and the second pixel units 6 are opposite.

Two adjacent rows of pixel units constitute a row unit group, and the gate line and the common electrode line between the two adjacent rows of pixel units are electrically connected with the first pixel units of the two adjacent rows of pixel units; and the gate line and the common electrode line between two adjacent row unit groups are electrically connected with the second pixel units of two rows of pixel units which are close to the gate line and the common electrode line. For a row unit group 8 and a row unit group 9 as shown in FIG. 1, two rows of pixel units in the row unit group 8 share the gate line and the common electrode line between the two rows of pixel units, the two rows of pixel units in the row unit group 9 share the gate line and the common electrode line between the two rows of pixel units, and the second row of pixel units of the row unit group 8 and the first row of pixel units of the row unit group 9 share the gate line and the common electrode line between the row unit group 8 and the row unit group 9.

The following structure is formed by the above description, that is, the first pixel units 5 included in each row of pixel units and the first pixel units 5 in the previous row/next row of pixel units share one gate line and one common electrode line, and second pixel units 6 included in each row of pixel units and second pixel units 6 in the next row/previous row of pixel units share one gate line and one common electrode line; wherein, each pixel unit is merely connected with one gate line and one common electrode line.

In this embodiment, the first pixel units 5 and the second pixel units 6 included in all the pixel units are arranged alternatively in the same rows/columns, and a plurality of first pixel units 5 of two adjacent rows share one gate line and one common electrode line between the two rows; or a plurality of second pixel units 6 of two adjacent rows share one gate line and one common electrode line, so that a dot inversion manner of row driving is completed by matching of the common electrode lines and the data lines to ensure relatively high display quality. It should be noted that the first pixel units 5 and the second pixel units 6 in the same row can not share the gate line and the common electrode line. Meanwhile, the positive and negative polarities of data signal voltages provided by the data lines do not need to be frequently switched, so that the display power consumption may be effectively reduced.

Preferably, one gate line and one common electrode line are arranged between two adjacent rows of pixel units, that is, a plurality of first pixel units 5 of two adjacent rows share the gate line and the common electrode line, or a plurality of second pixel units 6 of the two adjacent rows share the gate line and the common electrode line, so that every two adjacent rows of pixel units are flexibly controlled to realize dot inversion, and then dot inversion of all the pixel units on the array substrate is completed.

It should be noted that the data lines may be flexibly arranged. For example, as shown in FIG. 1, one data line is arranged between two adjacent columns of pixel units, and each data line is electrically connected with pixel electrodes 4 of one of the two columns of pixel units. Because the data line is arranged between the two adjacent columns of pixel units, the design difficulty is low.

Figure 2:
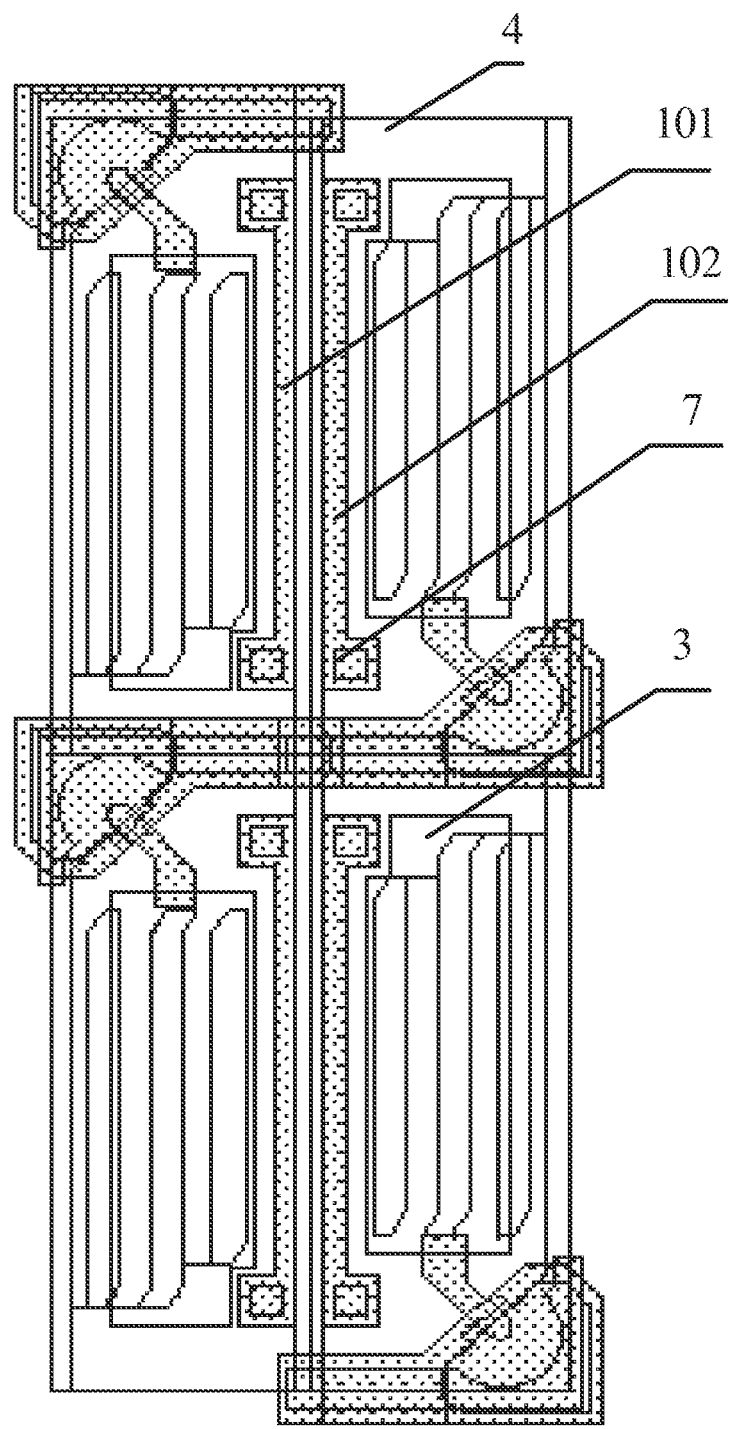
FIG. 2 is a schematic local structural diagram of another array substrate according to in an embodiment of the present invention.

For another example, FIG. 2 shows a schematic local structural diagram of an array substrate. Two adjacent columns of pixel units constitute a column unit group, and each pixel unit includes a common electrode 3. A data line 101 and a data line 102 are arranged between two columns of pixel units of each column unit group and electrically connected with pixel electrodes 4 of a column of pixel units which are close to the data line 101 and the data line 102 respectively. Obviously, in such a structure, any data line is no longer arranged between adjacent column unit groups. In such a design, an existing metal layer (such as a metal layer where the gate is located) may be made into sectional data lines, and the metal layer is located below an ITO layer where the pixel electrodes 4 are located. Two columns of data lines are parallel, and are electrically connected with the corresponding pixel electrodes 4 by via holes 7 respectively. In this embodiment, because the data lines are directly connected with the pixel electrodes 4 in a sectional manner, data signals may reach the pixel electrodes 4 more quickly.

For another example, pixel electrodes 4 of a column of pixel units may be connected together to form one data line, that is, the data line is a column of ITO layer connected together, so that an integrated structure of data line and a column of pixel electrodes 4 is formed, and two adjacent columns of data lines are not in contact with each other. This structure is favorable for simplifying a structure of the array substrate, thereby simplifying the production process and reducing the cost.

For common electrodes 3, the common electrodes 3 of the first pixel units located in two adjacent rows of pixel units and sharing one gate line and one common electrode line may be connected with each other, so that the structure of the array substrate is simplified.

Correspondingly, the common electrodes 3 of the second pixel units located in two adjacent rows of pixel units and sharing one gate line and one common electrode line may also be connected with each other, so that the structure of the array substrate is simplified.

The embodiment of the present invention has the following beneficial effects: the first pixel units and the second pixel units included in all the pixel units are arranged alternatively in same rows/columns, the plurality of first pixel units in different rows share one gate line and one common electrode line, and the plurality of second pixel units in different rows share one gate line and one common electrode line, so that a dot inversion manner of row driving is completed by matching of the common electrode lines and the data lines to ensure relatively high display quality; meanwhile, data signal voltages provided by the data lines do not need to be frequently switched, so that the display power consumption may be effectively reduced; and further, the data lines and the common electrodes may be designed according to practical requirement, so that the structure of the array substrate is simplified, the production process is simplified and the cost is reduced.

Figure 3:
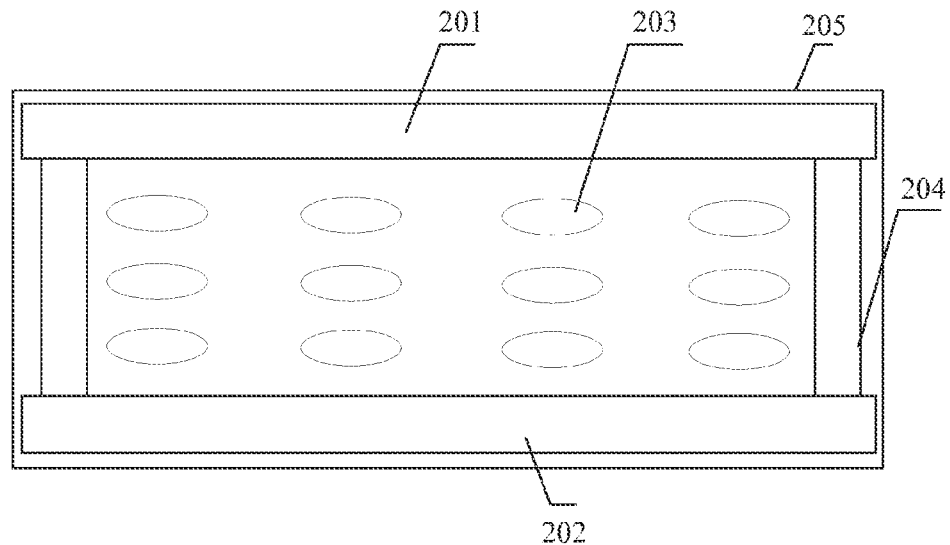
FIG. 3 is a schematic structural diagram of a display panel according to an embodiment of the present invention.

As shown in FIG. 3, an embodiment of the present invention provides a display panel, including a color filter substrate 201 and an array substrate 202 arranged oppositely, wherein the array substrate 202 is the one provided in the above-mentioned embodiments, and a liquid crystal layer 203 is arranged between the color filter substrate 201 and the array substrate 202. Certainly, the display panel may further include other necessary components, such as a frame 205, sealant 204, etc., which are not listed one by one herein.

The display panel according to this embodiment may be used as a component of any product with a display function, such as a liquid crystal display panel, electronic paper, an OLED panel, a mobile phone, a tablet computer, a television, a display, a laptop, a digital photo frame, a navigator, etc.

The embodiment of the present invention has the following beneficial effects: the first pixel units and the second pixel units included in all the pixel units are arranged alternatively in same rows/columns, the plurality of first pixel units in different rows share one gate line and one common electrode line, and the plurality of second pixel units in different rows share one gate line and one common electrode line, so that a dot inversion manner of row driving is completed by matching of the common electrode lines and the data lines to ensure relatively high display quality; meanwhile, data signal voltages provided by the data lines do not need to be frequently switched, so that the display power consumption may be effectively reduced; and further, the data lines and the common electrodes may be designed according to practical requirement, so that the structure of the array substrate is simplified, the production process is simplified and the cost is reduced.

An embodiment of the present invention provides a display device, including the display panel according to the above-mentioned embodiment.

Figure 4:
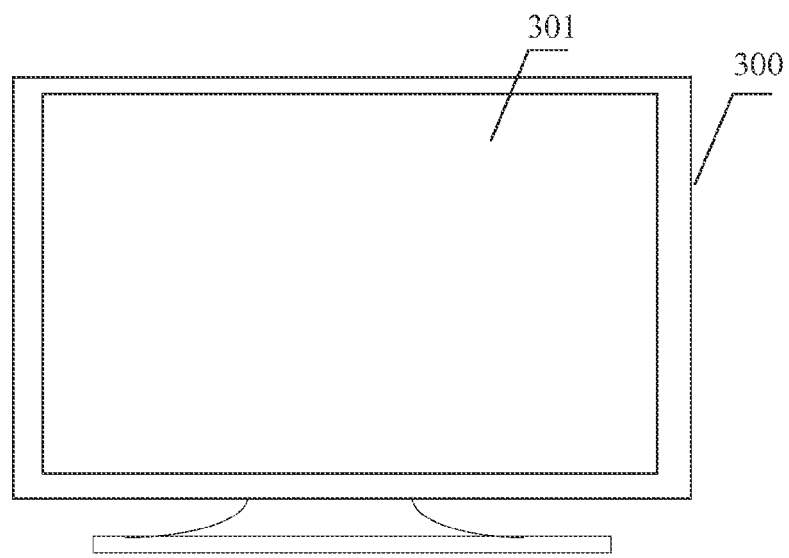
FIG. 4 is a schematic diagram of a first display device according to an embodiment of the present invention.
Figure 5:
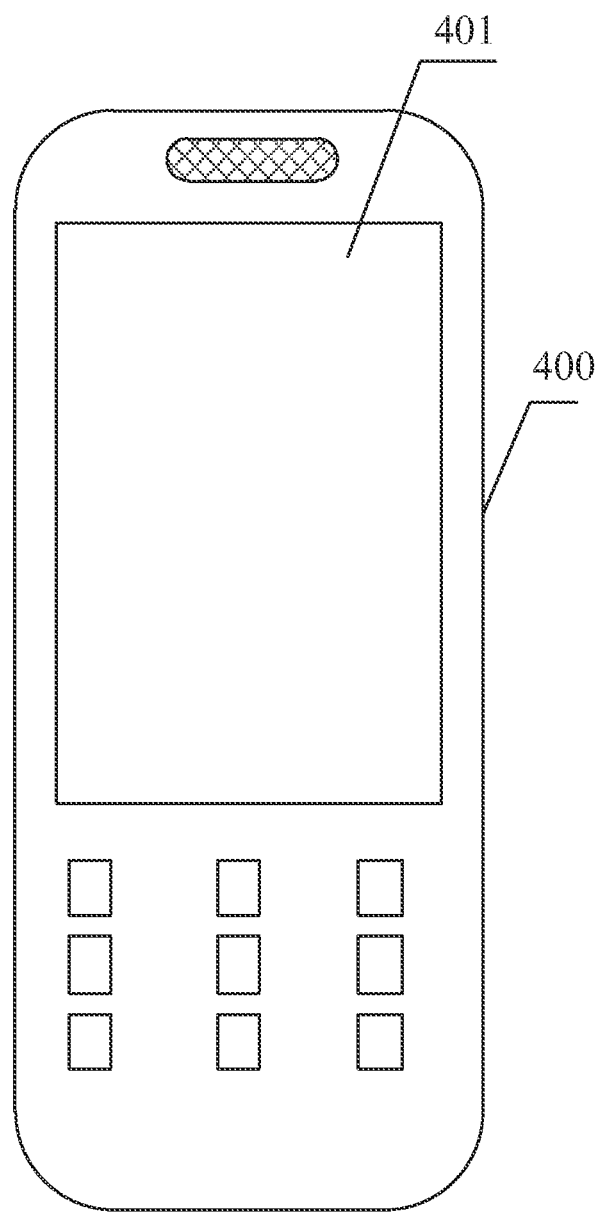
FIG. 5 is a schematic diagram of a second display device according to an embodiment of the present invention.

The display device according to this embodiment may be any product with a display function, such as a liquid crystal display panel, electronic paper, an OLED panel, a mobile phone, a tablet computer, a television, a display, a laptop, a digital photo frame, a navigator, etc. For example, a display 300 as shown in FIG. 4 includes a display panel 301. For another example, a mobile phone 400 as shown in FIG. 5 includes a display panel 401.

The embodiment of the present invention has the following beneficial effects: the common electrode lines and the data lines are matched to control polarity inversion signals and realize dot inversion, so as to ensure relatively high display quality; and alternating-current square wave voltage signals are used as common voltage signals, and voltages provided by the data lines do not need to be frequently switched, so that the display power consumption is effectively reduced. The first pixel units and the second pixel units included in all the pixel units are arranged alternatively in same rows/columns, the plurality of first pixel units in different rows share one gate line and one common electrode line, and the plurality of second pixel units in different rows share one gate line and one common electrode line, so that a dot inversion manner of row driving is completed through matching of the common electrode lines and the data lines to ensure relatively high display quality; meanwhile, data signal voltages provided by the data lines do not need to be frequently switched, so that the display power consumption may be effectively reduced; and further, the data lines and the common electrodes may be designed according to practical requirement, so that the structure of the array substrate is simplified, the production process is simplified and the cost is reduced.

An embodiment of the present invention provides a method for preparing the array substrate in the above-mentioned embodiments, including:

providing a substrate; forming a plurality of gate lines and a plurality of data lines crossed, a plurality of common electrode lines and an array of pixel units defined by the plurality of gate lines and the plurality of data lines on the substrate; wherein, each pixel unit includes a TFT, and a pixel electrode and a common electrode arranged oppositely;

electrically connecting gates of the TFTs with the gate lines, electrically connecting sources/drains of the TFTs with the common electrode lines, electrically connecting drains/sources of the TFTs with the common electrodes, and electrically connecting the pixel electrodes with the data lines;

ensuring that the pixel units include a plurality of first pixel units and a plurality of second pixel units with opposite potential polarities, wherein the first pixel units and the second pixel units are arranged alternatively in same rows/columns;

constituting a row unit group by two adjacent rows of pixel units, and electrically connecting the gate line and the common electrode line between the adjacent two rows of pixel units with the first pixel units of the two adjacent rows of pixel units; and electrically connecting the gate line and the common electrode line between two adjacent row unit groups with the second pixel units of two rows of pixel units which are close to the gate line and the common electrode line.

It should be noted that the array substrates of different architectures may have different hierarchical structures, and therefore, the above-mentioned method is completed according to the hierarchical structure of the array substrate.

Preferably, one gate line and one common electrode line are arranged between two adjacent rows of pixel units.

As for the data lines, they may be flexibly realized during preparation, which is illustrated below:

For example, one data line is arranged between two adjacent columns of pixel units, and each data line is electrically connected with the pixel electrodes of one of the two columns of pixel units.

For another example, two adjacent columns of pixel units constitute a column unit group, two data lines are arranged between two columns of pixel units of each column unit group, and each data line is electrically connected with the pixel electrodes of a column of pixel units which are close to the data line.

For another example, the pixel electrodes of a column of pixel units are connected together to form one data line.

Through the above-mentioned method for preparing the data lines, the data lines may be flexibly formed, and preparation of the data lines of the array substrate with relatively low cost is realized according to different designs or production or material supply conditions.

The above preparation of the data lines is merely for illustrating the present invention, rather than limiting the present invention.

Preferably, the common electrodes of the first pixel units located in two adjacent rows of pixel units and sharing one gate line and one common electrode line are connected with each other.

Preferably, the common electrodes of the second pixel units located in two adjacent rows of pixel units and sharing one gate line and one common electrode line are connected with each other.

The embodiment of the present invention has the following beneficial effects: the first pixel units and the second pixel units included in all the pixel units are arranged alternatively in same rows/columns, the plurality of first pixel units in different rows share one gate line and one common electrode line, and the plurality of second pixel units in different rows share one gate line and one common electrode line, so that a dot inversion effect of a row driving manner is completed by matching of the common electrode lines and the data lines to ensure relatively high display quality; and meanwhile, the positive and negative polarities of data signal voltages provided by the data lines do not need to be frequently switched, so that the display power consumption may be effectively reduced.

Obviously, various modifications and variations could be made to the present invention by those skilled in the art without departing from the spirit and scope of the present invention. Thus, provided that these modifications and variations made to the present invention are within the scope of the claims of the present invention and equivalent technologies thereof, the present invention is intended to cover these modifications and variations.

What is claimed is:

1. An array substrate, comprising:
    a substrate;
    an array of pixel units on the substrate;
    a plurality of gate lines and a plurality of data lines on the substrate, wherein the gate lines cross the data lines near pixel units of the pixel unit array;
    a plurality of common electrode lines,
    wherein each pixel unit comprises:
        a TFT,
        a pixel electrode, and
        a common electrode,
        wherein a gate of the TFT is electrically connected with a particular one of the gate lines, a source/drain of the TFT is electrically connected with a particular one of the common electrode lines, and a drain/source of the TFT is electrically connected with the common electrode,
        wherein the pixel electrode is electrically connected with the data line,
    wherein the array of pixel units comprises a plurality of first pixel units and a plurality of second pixel units with opposite potential polarities, wherein the first pixel units and the second pixel units are arranged alternatively in same rows/columns,
    wherein, two adjacent rows of pixel units constitute a row unit group, and the gate line and the common electrode line between the two adjacent rows of pixel units are electrically connected with the first pixel units of the two adjacent rows of pixel units, and the gate line and the common electrode line between two adjacent row unit groups are electrically connected with the second pixel units of two rows of pixel units which are adjacent to the gate line and the common electrode line.

2. The array substrate according to claim 1, wherein one of the gate lines and one of the common electrode lines are each arranged between two adjacent rows of pixel units.

3. The array substrate according to claim 1, wherein one of the data lines is arranged between two adjacent columns of pixel units, and each data line is electrically connected with the pixel electrodes of one of the two columns of pixel units.

4. The array substrate according to claim 1, wherein two adjacent columns of pixel units constitute a column unit group, two of the data lines are arranged between two columns of pixel units of each column unit group, and each data line is electrically connected with the pixel electrodes of a column of pixel units which are adjacent to the data line.

5. The array substrate according to claim 1, wherein the pixel electrodes of a column of pixel units are connected together to form one of the data lines.

6. The array substrate according to claim 1, wherein the common electrodes of the first pixel units located in two adjacent rows of pixel units and sharing one of the gate lines and one of the common electrode lines are connected with each other.

7. The array substrate according to claim 1, wherein the common electrodes of the second pixel units located in two adjacent rows of pixel units and sharing one of the gate lines and one of the common electrode lines are connected with each other.

8. A display panel, comprising the array substrate according to claim 1.

9. A display device, comprising the display panel according to claim 8.

10. A method of preparing an array substrate, comprising:
    providing a substrate;
    forming an array of pixel units on the substrate;
    forming a plurality of gate lines and a plurality of data lines, wherein the gate lines cross the data lines near pixel units of the pixel unit array;
    forming a plurality of common electrode lines on the substrate,
    wherein each pixel unit comprises:
        a TFT,
        a pixel electrode, and
        a common electrode;
    electrically connecting gates of the TFTs with the gate lines;
    electrically connecting sources/drains of the TFTs with the common electrode lines;
    electrically connecting drains/sources of the TFTs with the common electrodes;
    electrically connecting the pixel electrodes with the data lines,
    wherein the array of pixel units comprises a plurality of first pixel units and a plurality of second pixel units with opposite potential polarities, wherein the first pixel units and the second pixel units are arranged alternatively in same rows/columns;
    constituting a row unit group by two adjacent rows of pixel units, and electrically connecting the gate line and the common electrode line between the two adjacent rows of pixel units with the first pixel units of the two adjacent rows of pixel units; and
    electrically connecting the gate line and the common electrode line between two adjacent row unit groups with the second pixel units of two rows of pixel units which are adjacent to the gate line and the common electrode line.

11. The method according to claim 10, wherein one of the gate lines and one of the common electrode lines are each arranged between two adjacent rows of pixel units.

12. The method according to claim 10, wherein one of the data lines is arranged between two adjacent columns of pixel units, and each data line is electrically connected with the pixel electrodes of one of the two columns of pixel units.

13. The method according to claim 10, wherein two adjacent columns of pixel units constitute a column unit group, two of the data lines are arranged between two columns of pixel units of each column unit group, and each data line is electrically connected with the pixel electrodes of a column of pixel units which are adjacent to the data line.

14. The method according to claim 10, wherein the pixel electrodes of a column of pixel units are connected together to form one of the data lines.

15. The method according to claim 10, wherein the common electrodes of the first pixel units located in two adjacent rows of pixel units and sharing one of the gate lines and one of the common electrode lines are connected with each other.

16. The method according to claim 10, wherein the common electrodes of the second pixel units located in two adjacent rows of pixel units and sharing one of the gate lines and one of the common electrode lines are connected with each other.

* * * * *